United States Patent
Schwab

(10) Patent No.: US 7,423,871 B2
(45) Date of Patent: Sep. 9, 2008

(54) ELECTRIC DEVICE WITH IMPROVED COOLING AND CASING THEREFOR

(75) Inventor: Markus Schwab, Brunnenrain (CH)

(73) Assignee: DET International Holding Limited, George Town, Grand Cayman (KY)

( * ) Notice: Subject to any disclaimer, the term of this patent is extended or adjusted under 35 U.S.C. 154(b) by 0 days.

(21) Appl. No.: 10/579,379

(22) PCT Filed: Nov. 14, 2003

(86) PCT No.: PCT/CH03/00751

§ 371 (c)(1), (2), (4) Date: Jan. 10, 2007

(87) PCT Pub. No.: WO2005/048672

PCT Pub. Date: May 26, 2005

(65) Prior Publication Data
US 2007/0215329 A1 Sep. 20, 2007

(51) Int. Cl.
H05K 7/20 (2006.01)
F28F 7/00 (2006.01)

(52) U.S. Cl. ............... 361/695; 361/697; 361/704; 361/719; 165/80.3; 165/104.33

(58) Field of Classification Search ............ 361/687, 361/690–697, 704, 719; 165/80.3, 104.33, 165/121–122, 185; 454/184
See application file for complete search history.

(56) References Cited

U.S. PATENT DOCUMENTS 4,699,208 A 10/1987 Wolf et al.
5,856,909 A 1/1999 Kamo et al.
6,069,792 A * 5/2000 Nelik .......................... 361/687
6,081,425 A * 6/2000 Cheng ........................ 361/704
6,175,494 B1 * 1/2001 Komatsu .................... 361/692
6,381,134 B2 * 4/2002 Iwasaki ...................... 361/695
6,735,080 B1 * 5/2004 Chang ........................ 361/695
7,289,320 B2 * 10/2007 Chang et al. ................ 361/690
7,312,992 B2 * 12/2007 Jory et al. ................... 361/696
2002/0026996 A1 3/2002 Krieger et al.
2003/0076652 A1 * 4/2003 Ahn .......................... 361/683
2003/0184961 A1 * 10/2003 Ahn .......................... 361/683

FOREIGN PATENT DOCUMENTS

EP 0 900 621 A2 3/1999
EP 0 914 030 A1 5/1999

* cited by examiner

Primary Examiner—Jayprakash N Gandhi
Assistant Examiner—Robert J Hoffberg
(74) Attorney, Agent, or Firm—Gallagher & Kennedy, P.A.; Thomas D. MacBlain

(57) ABSTRACT

The casing of a power supply includes a bottom and a cover. Both of them have a U-like shape. Since the cover is slightly wider than the bottom two air ducts are provided between the side plates of the bottom and the corresponding side plates of the cover respectively. A printed circuit board is mounted within the casing, particularly on the bottom. Different mechanical, electric and/or electronic components are mounted on the printed circuit board. Furthermore, heat generating components are mounted on the printed circuit board such that they are in right contact with the side plates of the bottom. The waste heat generated by the components is transferred to the side plates of the bottom and further on to the cover and its side plates. From there the heat is dissipated into the air and particularly into the air ducts from where it is dissipated by the air flow from two fans that are arranged at the inlet of the air ducts.

25 Claims, 3 Drawing Sheets

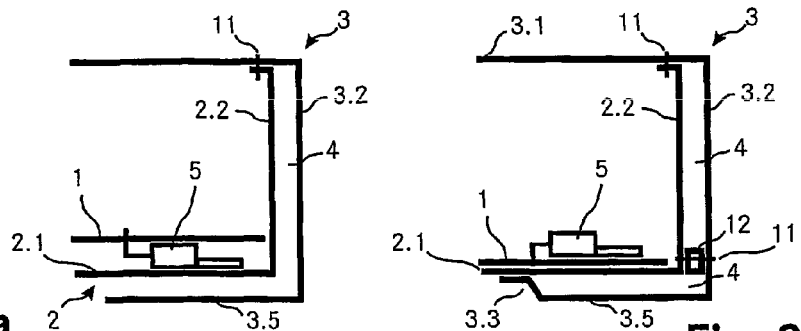
Fig. 8a  Fig. 8b
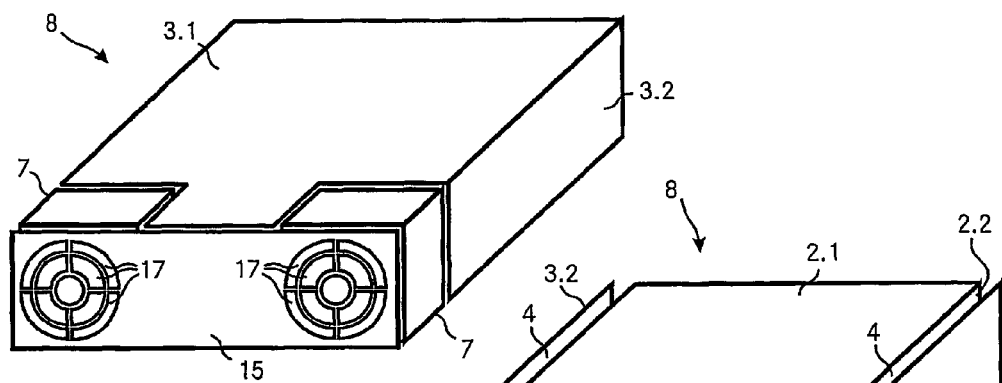
Fig. 9
Fig. 10
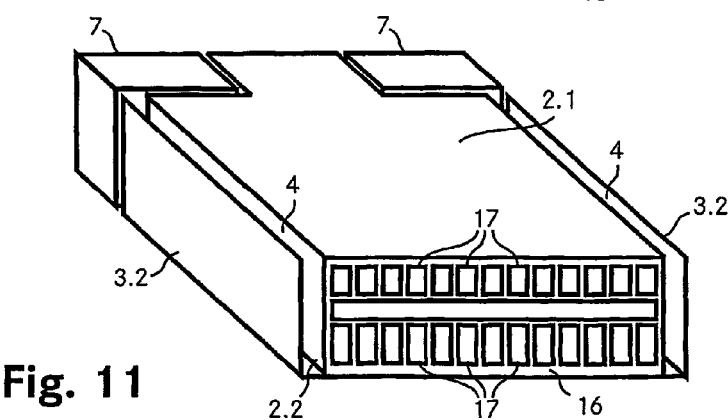
Fig. 11

ELECTRIC DEVICE WITH IMPROVED COOLING AND CASING THEREFOR

CROSS REFERENCE TO RELATED APPLICATIONS

This application is the National Stage application of the Patent Cooperation Treaty Application No. PCT/CH2003/000751, from which priority is claimed.

TECHNICAL FIELD

The invention relates to an electrical and/or electronic device, particularly a power supply, including a casing, an electric and/or electronic circuit with a heat generating component and at least one fan, where the heat generating component is in thermal contact with a wall portion of the casing.

Over the past years, there has been a rapidly increasing demand for electrically operated devices with an ongoing trend towards devices with smaller dimensions and less weight. These requirements not only apply to the whole devices, but also to each single element of such devices such as for example the electric components like the power supply.

One problem with such devices is that the smaller the electric and/or electronic circuits become, the more waste heat is generated in a given volume and the more heat has to be removed from that given volume.

One possible solution is to add more heat sinks. But in many cases there is not enough space left for additional heat sinks. In a known space-efficient cooling technique the heat generating components such as for example the power semiconductors of a power supply are directly bonded to the casing of the power supply that is made of aluminum. The heat generated by the power semiconductors is transferred to the casing from where it is dissipated into the air.

However, this cooling method has the drawback that the maximum power to be dissipated is very limited.

SUMMARY OF THE INVENTION

It is therefore an object of the invention to create an electrical and/or electronic device pertaining to the technical field initially mentioned, that avoids the drawbacks of the prior art and that particularly enables a space-efficient cooling of the device with improved cooling properties.

The solution of the invention is specified by the features of this invention. According to the invention the electric device (which means an electrical and/or electronic device, for example a power supply, an amplifier or the like) includes a casing and an electric circuit (which means an electric and/or electronic circuit). The casing includes a double wall portion with an inner wall portion that is a part of the inner surface of the casing and an outer wall portion that is a part of the outer surface of the casing. The double wall portion defines an air duct between the inner wall portion and the outer wall portion. The power supply further includes a fan that is arranged such that the air flow produced by the fan, or at least a part of it, is directed through the air duct.

Typically, the circuit includes a plurality of components such as mechanical, electric and/or electronic components. Among other components, the circuit includes one or more heat generating components such as for example an inductive element of a transformer or power semiconductors. The heat generating component is arranged within the casing such that it is in thermal contact with the inner wall portion of the double wall portion of the casing. Therefore, said double wall portion acts as a heat sink for the heat produced by the heat generating component. The heat then is emitted from the casing to the surrounding air and also to the air duct from where it is dissipated by the air flow from the fan.

The heat generating component does not have to be in direct physical contact with the inner wall portion. The thermal contact between the heat generating component and the inner wall portion of the casing could also be established via a heat conducting adapter, such as for example an aluminum block, an aluminum angle plate, a heat-pipe or any other suitable heat conductor.

Without the intention to limit the scope of protection of the invention, but rather to simplify the description, the term power supply is used hereinafter in an exemplary fashion instead of one or more of the terms electric device or electrical and/or electronic device unless otherwise mentioned.

With a power supply according to the invention, a very efficient heat dissipation can be achieved. Since the heat generating components are in good thermal contact with the casing of the power supply, the heat generated by the power supply can be effectively transferred to the casing. Furthermore, by providing an air duct within the casing, the surface for transferring the heat from the casing to the surrounding air can be increased. And finally, the fan produces a high air flow through the air duct that efficiently dissipates the heat from the air duct.

Another advantage is that the space requirements are low. The air duct in the double wall portion can be provided very space-efficiently. Furthermore, the additional costs for providing a double wall portion of the casing are significantly smaller than for providing a supplementary traditional heat sink.

Moreover, the invention enables very flexible designs because the shape and the dimensions of the air duct can be varied very easily and in a wide range.

For example, the cross sectional area or the shape of the cross section of the air duct can be varied. The air duct can have a closed cross section such as for example a rectangular, a circular or an oval cross section. In this case, all of the air transits the air duct. The air duct may also have holes where some of the air may escape from the air duct. The air duct can also have an open cross section such as, for example, a C-like or a U-like cross section. In this case, some of the air that enters the air duct leaves the air duct through the open side of it and does not transit entirely through it.

As long as the casing is stable enough and sturdy, it could be made of any suitable material such as, for example, any synthetic material or metals. But in order to enhance the heat transfer from the heat generating component to the casing and further to the air, the casing is preferably made of a material with a high coefficient of thermal conductivity such as, for example, metals like copper of aluminum. The usage of aluminum is favored because of its lower specific gravity and the lower manufacturing costs.

The electric circuit can be realized in any known manner. However, printed circuit boards are commonly used and are therefore preferred to implement the circuit. Since the heat generating component is a part of the circuit, it is electrically connected to the printed circuit board in some way. For example, the component is mounted directly on the surface of the board or the component includes wires that are soldered to the circuit board. The component may also be connected to the circuit board by a flexible connection such as cable.

Since the shape of the casing is not critical for the realization of the invention, almost any shape of the casing is possible. However, in order that a power supply according to the invention can be applied in many different applications, the appropriate standards should be observed. That is why the shape of the casing is preferably cubical with the dimensions corresponding to the relevant standards of the particular application.

The casing can be of a one-piece or a multi-piece design. A one-piece design has the advantage that there is no need to assemble the casing, but it is more difficult to assemble the whole power supply, since most parts of the power supply are arranged within the casing. In a preferred embodiment of the invention, the casing includes multiple pieces, at least a bottom and a cover, where the printed circuit board is mounted on the bottom. The inner wall portion of the air duct is a part of the bottom and the outer wall portion of the air duct is a part of the cover.

To form the casing, the bottom and the cover are fitted together so that a good thermal contact between them is accomplished and so that the inner wall portion and the outer wall portion are arranged to form the air duct. Since the power supply can be assembled at least partially before the bottom and the cover are fitted together, it is less laborious to manufacture the whole power supply.

Additionally to the bottom and the cover, the casing may include further pieces, such as, for example, a separate front or rear panel.

There are many possibilities to assemble the bottom and the cover such as, for example, by means of rivets, nuts and bolts, screws or other fasteners and the like or by welding, soldering, bonding, gluing and the like. In a preferred embodiment of the invention the bottom and the cover are screwed together because screwing is a simple, fast and cost-efficient method for assembling two pieces of metal.

The screwing together alone generates a good thermal contact between the bottom and the cover. To further improve the thermal conduction between bottom and cover, thermal paste can be applied between contacting parts of the bottom and the cover before they are fitted together.

The bottom of the casing includes a base plate and a side plate which are arranged such that they are perpendicular to each other having a common edge. The side plate of the bottom is designated hereafter as the bottom side plate. The cover piece of the casing includes a top plate and a further side plate, hereafter designated as the cover side plate. The top plate and the cover side plate are also arranged perpendicular to each other and have a common edge. The bottom side plate forms the inner wall portion, the cover side plate forms the outer wall portion of the casing's double wall portion.

The printed circuit board is mounted on the bottom such that it is substantially parallel to the base plate and that one edge of the printed circuit board is in contact with the bottom side plate or is at least situated close to it. The heat generating component is mounted on the printed circuit board in the immediate vicinity of that edge such that the heat generating component is in contact with the bottom side plate or is positioned close to it. In order to have a good thermal contact the heat generating component can further be pressed against the bottom side plate by any suitable means such as, for example, bonding.

As outlined above, the casing is of substantially a cuboid shape and the cover side plate forms the outer wall portion of the double wall portion. In an advantageous embodiment of the invention, the cover side plate also forms an outer surface of the power supply's casing, particularly a lateral surface of the cuboid casing. Therefore, the air duct is positioned along a lateral surface of the cuboid casing. That is, the air duct leads from a front surface of the casing to the rear surface. The front surface includes at least one aperture where the air flow from the fan can enter the air duct. Similarly, the rear surface of the casing also includes at least one aperture such that the air flow can escape from the air duct.

Typically, the air flow through the air duct is always in the same direction, entering the air duct at an inlet, passing through it and quitting it at an outlet. The inlet is formed by the corresponding end regions of the bottom side plate and the cover side plate in the region of the front surface. The air flow through the air duct with straight end regions of these side plates may be sufficient for many applications. Other applications require increased cooling capabilities and therefore an increased air flow through the air duct. An increased air flow can be achieved by an inlet with a funnel-like shape. A simple and preferred way to realize a funnel-like shape of the inlet is bending the ed region of the bottom side plate to an inner side of the casing.

The fan that generated the air flow through the air duct is preferably arranged on the front surface of the cuboid casing. It is arranged such that it covers the inlet of the air duct at least partially so that the air flow of the fan or a part of the air flow can directly enter the air duct.

It would also be possible to position the fan somewhere else and direct the air flow to the inlet of the air duct by supplementary means, but this would mean additional effort and hence additional costs.

To increase the cooling capabilities of the power supply even more, an additional heat sink is mounted within the air duct such that the air flow through the air duct also dissipates the heat from the additional heat sink. Here it is important that the additional heat sink is in good thermal contact with the double wall portion of the casing, that is, either with one or more inner surfaces of the air duct. This ensures a good heat transfer from the casing to the additional heat sink.

As explained above, the invention can be applied in power supplies or other electrical devices where waste heat is generated. A preferred application of the invention are power supplies where the waste heat is generated by one or more power semiconductors, such as diodes, thyristors, transistors, triacs or other heat generating power semiconductors.

Since a typical power supply has more than one outer surface, it is advantageous to provide further air ducts, particularly a second air duct at another outer surface of the casing. For this purpose, the casing includes a second double wall portion with an inner wall portion and an outer wall portion that define a second air duct along the other surface of the casing. The air flow through the second air duct may be generated by the first fan or the power supply may include a second fan (or even further fans) to produce this second air flow. Since the second air duct acts as a second heat sink, more waste heat can be dissipated.

In the case of a cuboid casing of the power supply, the second double wall portion is preferably located along the second lateral surface of the casing and a second fan is arranged at the same surface as the first fan such that the air flow from the second fan is directed through the second air duct.

Other advantageous embodiments and combinations of features come out from the detailed description below and the totality of the claims.

BRIEF DESCRIPTION OF THE DRAWINGS

The drawings used to explain the embodiments show:

FIG. 8a-FIG. 8b detailed views of the cross section of the double wall portion of another embodiment of a power supply according to the invention;

FIG. 9 an assembled power supply according to the invention in a top view;

FIG. 10 the power supply of FIG. 9 in a bottom view and

FIG. 11 the power supply of FIG. 9 in a back view.

PREFERRED EMBODIMENTS

Figure 1:
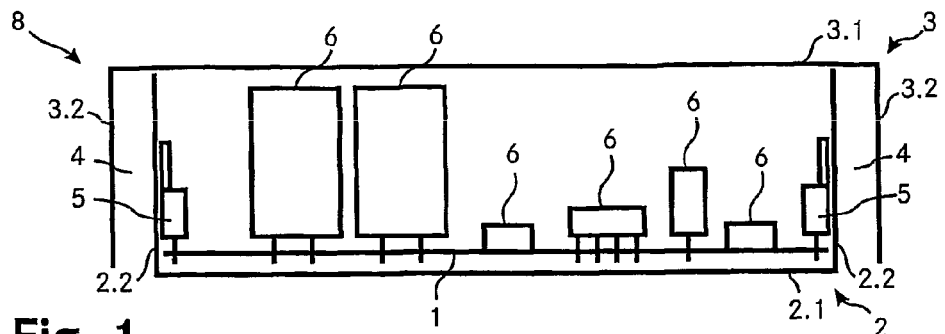
FIG. 1 A schematic cross section of a power supply according to the invention in a front view.

FIG. 1 shows a schematic illustration of a cross section of a power supply 8 according to the invention. The power supply 8 includes a casing with a bottom 2 and a cover 3 that are made of aluminum sheets. Although larger or smaller power supplies can be realized, the length of the power supply 8 is typically between 10 cm and 40 cm, the width between 4 cm and 25 cm and its height between 4 cm and 25 cm. While certain applications require thicker or thinner sheets, the thickness of the aluminum sheets varies typically between 0.5 mm and 3 mm. The bottom 2 includes a bottom plate 2.1 and two inner side plates 2.2 and the cover 3 includes a top plate 3.1 and two outer side plates 3.2 The bottom 2 is built such that it has a U-like shaped cross section, where the bottom plate 2.1 is the base of the U and the inner side plates 2.2 are the arms of the U. The cover 3 is also built such that is has a U-like shaped cross section, where the top plate 3.1 is the base of the U and the outer side plates 2.2 are the arms of the U.

The cover 3 is wider than the bottom 2. They can therefore be assembled by inserting the bottom 2 into the cover 3 and fitted together by suitable means so as to achieve a good thermal conduction between the bottom 2 and the cover 3. They are, for example, screwed (not shown in FIG. 1). When fitted together, the inner side plates 2.2 of the bottom 2 and the outer side plates 3.2 of the cover 3 define two air ducts 4.

A printed circuit board PCB 1 is mounted on the bottom 2 such that it is substantially parallel to the bottom plate 2.1. Different components 6 are mounted on the PCB 1. These may be mechanical, electric, electronic or other components. The components can be positioned directly on the surface of the PCB 1 and soldered to corresponding soldering pads or they can be equipped with one or more wires that are soldered into corresponding holes in the PCB 1. The components can also be differently fitted to the PCB 1 as long as the necessary electrical and mechanical connections are established.

Near the border of the PCB 1 in the vicinity of the inner side plates 3.2, heat generating components 5 are mounted. They are arranged such that they contact the inner side plates 2.2. Furthermore, they are tightly fitted t other inner side plates 2.2 so as to achieve a good thermal conduction between the heat generating components 5 and the inner side plates 2.2.

In order to allow a better understanding, the figures show a small gap between the bottom 2 and the cover 3 although they are tightly pressed together. The same applies to the illustration of the contact between the heat generating components 5 and the inner side plates 2.2.

Figure 2:
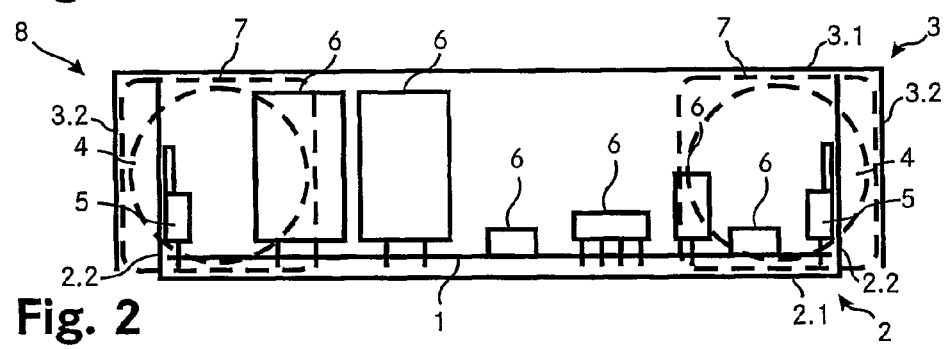
FIG. 2 the cross section of FIG. 1 including two fans.

In FIG. 2, the same power supply 8 is shown as in FIG. 1. The only difference is that FIG. 2 shows two fans 7, the positions of which are indicated with dashed lines. The fans 7 produce an air flow (not shown) that runs perpendicular to the drawing plane, partially through the inside of the casing and partially through the air ducts 4.

Thanks to the good thermal conduction between the heat generating components 5 and the inner side plates 2.2 as well as between the bottom 2 and the cover 3, the waste heat generated by the heat generating components 5 is efficiently transferred to the inner wide plates 2.2, to the top plate 3.1 and the outer side plates 3.2. With such an arrangement, the waste heat can be efficiently spread over an enlarged surface area of the bottom 2 and the cover 3 both on the inside and on the outside of the casing. This means that the waste heat can be efficiently dissipated to the air within the casing, on the outside of the casing and within the air ducts 4. Hence, the air flow produced by the fans 7 efficiently dissipates the heated air within the casing as well as within the air ducts 4.

Figure 3:
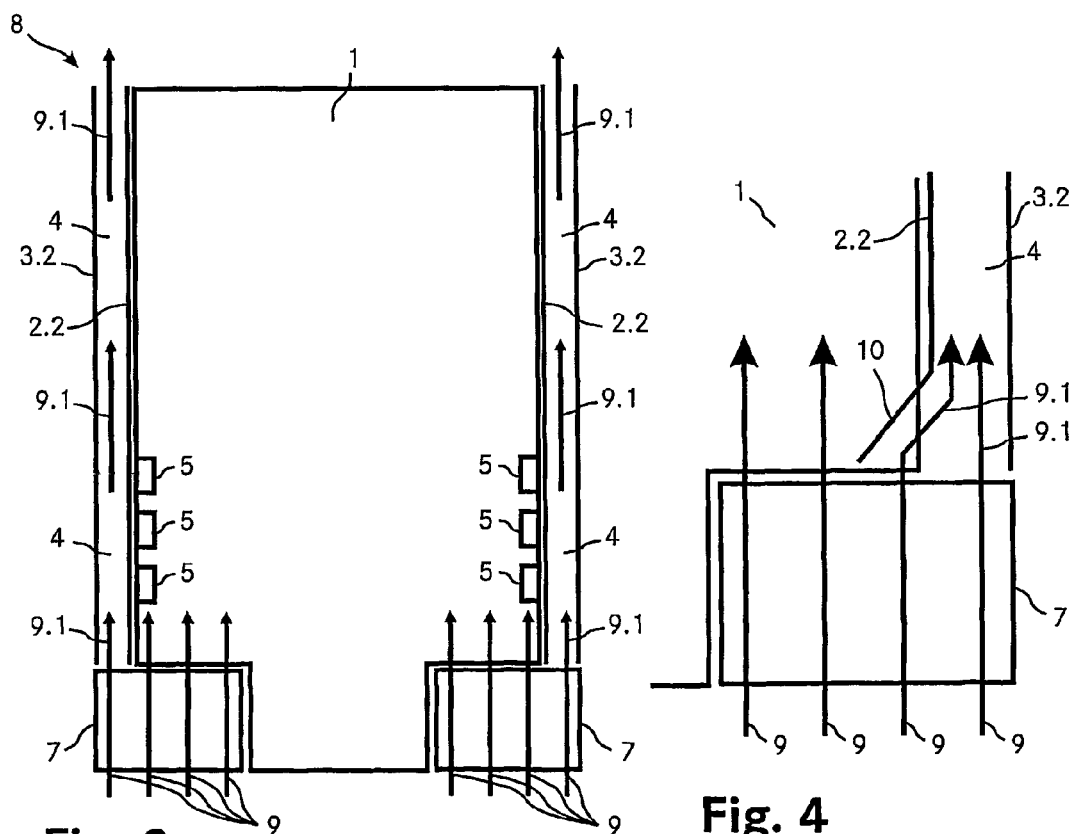
FIG. 3 a schematic cross section of the power supply of FIG. 1 in a top view.

FIG. 3 shows a cross section of the power supply 8 parallel to the bottom plate 2.1 in a top view. Here, the PCB 1 with the heat generating components 5 can be seen as well as the inner side plates 2.2, the outer wide plates 3.2 and the fans 7. The arrows 9 illustrate the air flow from the fans 7 and the arrows 9.1 designate the air flow through the air ducts 4.

Figure 4:
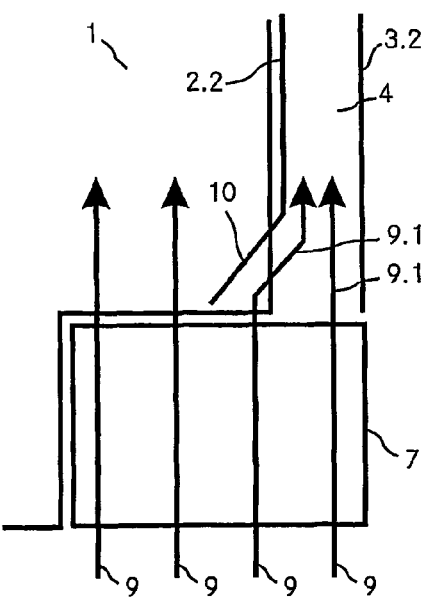
FIG. 4 a detailed view of the cross section of another power supply according to the invention.

FIG. 4 shows a detailed view of the cross section of another power supply according to the invention. Particularly, FIG. 4 shows the inlet of an air duct 4. The inlet is formed by the front sections of the inner side plate 2.2 and the outer side plate 3.2. In this embodiment, the front section 10 of the inner side plate 2.2 is bent towards the inside of the casing such that the inlet has a funnel-like shape. As a result, more air is blown through the air duct 4 by the fan 7 as shown by the arrows 9.1.

In FIG. 5, some schematic open cross sections of different implementations of the bottom 2 and the cover 3 to achieve good thermal conduction are illustrated. To simplify the drawings, neither the components 6 nor the heat generating components 5 are shown. In FIG. 5a the upper edge 2.3 of the inner side plate 2.2 is orthogonally angled to an inner side of the casing such that it is parallel to the top plate 3.1. By means of a connection 11, for example, a screw or a nut with corresponding bolt, that is positioned in the range of the angled upper edge 2.3, the bottom 2 and the cover 3 are fitted together such that the angled upper edge 2.3 is tightly pressed against the inner surface of the top plate 3.1.

Figure 5A:
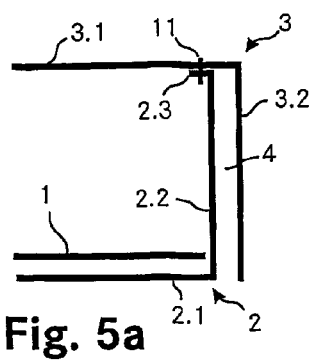
FIG. 5a-FIG. 5f detailed views of the cross section of the double wall portion of the power supply shown in FIG. 1 in different implementations with an open air duct.
Figure 5B:
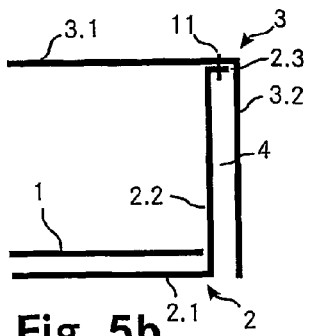
Figure 5C:
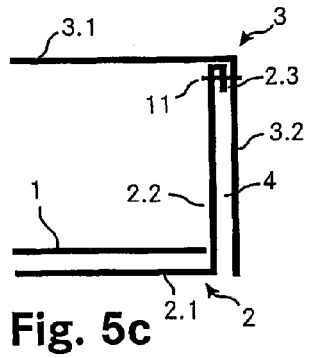

In FIG. 5b the upper edge 2.3 is orthogonally angled outwardly with respect to the casing of the power supply 8. The connection 11 corresponds to the connection 11 as shown in FIG. 5a. In FIG. 5c the upper edge 2.3 is angled twice such that it has a U-shape. Here, the screw or bolt of the connection 11 is arranged orthogonally to the inner side plate 2.2 and the outer side plate 3.2. By varying the width of the U of the upper edge 2.3, the distance between the inner side plate 2.2 and the outer side plate 3.2, that is the width of the air duct 4, can be varied.

Figure 5D:
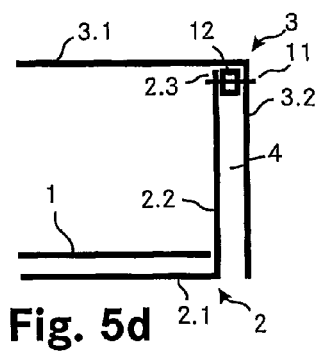

In FIG. 5d, the upper edge 2.3 of the inner side plate 2.2 is not angled but straight. In order to have the parallel surfaces that are necessary for a good thermal contact between the bottom 2 and the cover 3, a spacer 12 is inserted into the upper part of the air duct 4. The connection 11 is arranged orthogonally to the inner side plate 2.2 and the outer side plate 3.2 right through the spacer 12. To ensure a good thermal conduction, the spacer 12 also is made of aluminum.

Figure 5E:
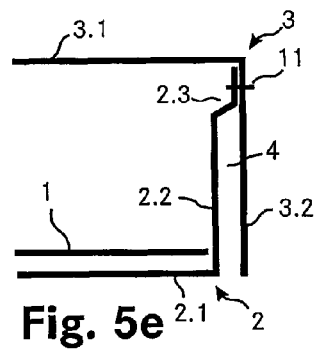
Figure 5F:
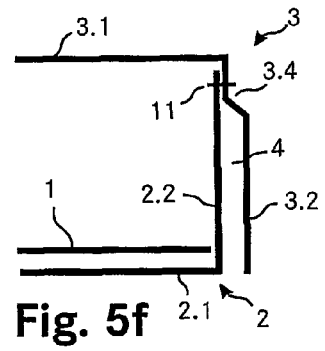
Figure 6A:
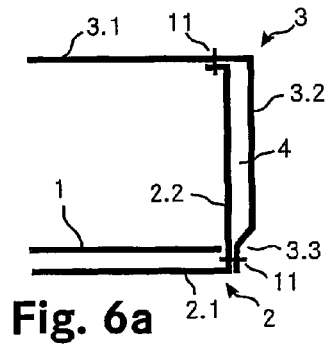
FIG. 6a-FIG. 6d detailed views of the cross section of the double wall portion of the power supply shown in FIG. 1 in different implementations with closed air duct.
Figure 6B:
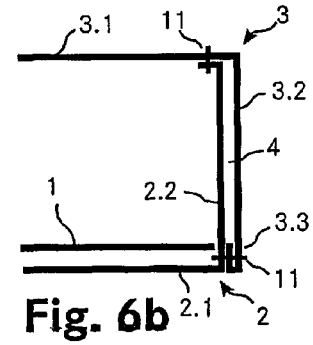
Figure 6C:
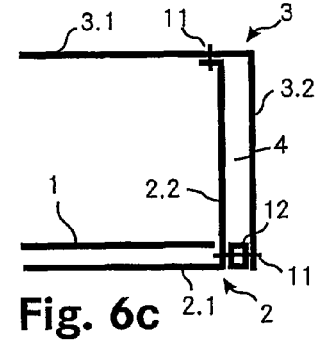
Figure 6D:
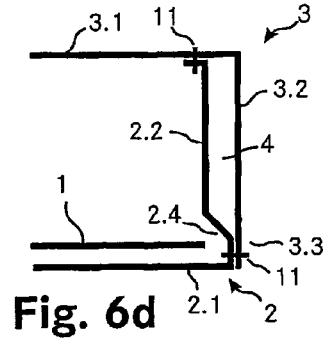

FIG. 5e shows an embodiment where the upper edge 2.3 of the inner side plate 2.2 is bent twice and has the shape of a Z such that its most upper part again is parallel to the outer side plate 3.2. In FIG. 5f, it is not the inner side plate 2.2 that is bent but it is the corresponding portion 3.4 of the outer side plate 3.2 that is bent Z-like.

All embodiments of FIG. 5 have a common feature, the air duct 4 is not closed but open.

In FIG. 6, various embodiments of the power supply 8 are shown where the bottom 2 and the cover 3 define a closed or at least a partially closed air duct 4. To achieve this, either the lower edge 3.3 of the outer side plate 3.2 or the corresponding lower portion 2.3 of the inner side plate 2.2 are built correspondingly. In FIG. 6a the lower edge 3.3 of the outer side plate 3.2 is bent Z-like and in FIG. 6b it is bent U-like. As shown in FIG. 6c, the air duct 4 can also be closed by a spacer 12 that is inserted into the lower part of the air duct 4. In FIG. 6d the lower portion 2.4 of the inner wide plate 2.2 is bent Z-like to realize the necessary distance between the inner side plate 2.2 and the outer side plate 3.2. To enhance the heat transfer from the bottom 2 to the cover 3, a second connection 11 can be provided at the lower end of the air duct 4.

In all of the embodiments shown, it is possible to vary the dimensions of the air duct 4 in a wide range by changing the shape of the bottom 2 and/or the cover 3. The dimensions and therewith also the cooling properties of the air duct 4 can be chosen such that the requirements of a particular application are met as good as possible.

Figure 7A:
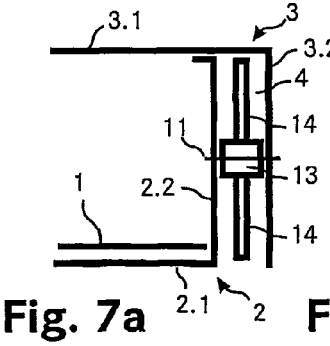
FIG. 7a-FIG. 7b detailed views of the cross section of the double wall portion of the power supply shown in FIG. 1 in different implementations with an additional heat sink within the air duct.
Figure 7B:
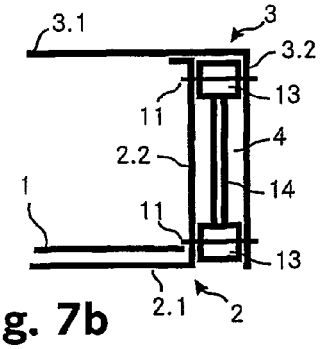

As mentioned above, an additional heat sink can be inserted into the air duct 4 to further improve the heat dissipation. FIG. 7 shows two examples how this could be done. In FIG. 7a a heat sink with a single base block 13 with two laterally extending fins 14 is shown. The connection 11 is positioned such that the base block 13, the inner wide plate 2.2 and the outer site plate 3.2 are tightly pressed together. Thanks to the tight contact between the base block 13 and the inner side plate 2.2 as well as the outer site plate 3.2, the waste heat can be transferred to the fins 14 that are efficiently cooled by the high air flow through the air duct 4. In the exemplary embodiment of FIG. 7b the additional heat sink includes a base block 13 at the upper end of the air duct 4 and a base block 13 at the lower end of it, both of them being connected by a fin 14. Naturally it is also possible to provide more base blocks 13 or fins 14 within the air duct 4.

It is not necessary that the heat generating component 5 is mounted on the PCB 1 such that it is in tight contact with the inner side plate 2.2. Generally, it is also possible that the heat generating component 5 is in thermal contact with any other inner surface of the power supplies casing. FIG. 8a shows an embodiment where the heat generating component is mounted on the lower surface of the PCB 1 such that it is in thermal contact with the bottom plate 2.1 of the bottom 2. The outer side plate 3.2 is formed such that is includes a lower portion 3.5 that is parallel to the bottom plate 2.1 and covers that area of the bottom plate 2.1 where the heat generating component 5 is positioned.

FIG. 8b shows a similar embodiment where the edge 3.3 of the lower portion 3.5 is bent Z-like to realize a closed air duct 4. The air duct 4 is separated into two single air ducts 4 by means of a spacer 12. Further it is to note that the heat generating component 5 is mounted on the upper surface of the PCB 1. In this case, a good thermal conduction between the PCB 1 and the bottom plate 2.1 has to be ensured.

It is understood that all of the embodiments shown in the figures, particularly each type of connection between the bottom 2 and the cover 3, can be combined with each other to realize further embodiments of the inventive power supply.

Moreover, to enhance the heat transfer between the bottom 2 and the cover 3, thermal paste (not shown in the figures) can be applied on the contacting areas before fitting together the bottom 2 and the cover 3.

The FIGS. 9, 10 and 11 show an assembled power supply 8 according to the invention in a top view (FIG. 9), a bottom view (FIG. 10) and a back view (FIG. 11). Shown are the cover 3 with the top plate 3.1 and the outer side plates 3.2, the bottom 2 with the bottom plate 2.1 and the inner side plates 2.2, the fans 7 and the air ducts 4.

Furthermore, FIGS. 9 and 10 show a front panel 15 with suitable ventilation apertures 17 for the fans 7. The front panel 15 can be built separately or it can be a part of the bottom 2 or the cover 3.

In the back view of the power supply 8 in FIG. 11 a rear panel 16 is shown. It includes a plurality of ventilation apertures 17 as the outlets for the air that is directed through the casing. Typically, the rear panel includes connecting means such as plugs ad the like (not shown) to connect the power supply 8 to the device that has to be supplied with power.

In summary, it is to be noted that the invention enables the manufacturing of electric devices such as, for example, power supplies with highly improved cooling capabilities while only a minimum of extra space is required. Furthermore, the stability and sturdiness of the casing of the power supply can also be improved, since the bottom and the cover can be provided with additional contacting and fixation areas.

The foregoing descriptions of at least one preferred embodiment are exemplary and not intended to limit the claimed invention. Obvious modifications that do not depart from the spirit and scope of the invention as claimed will be apparent to those skilled in the art.

The invention claimed is:

1. An electric device, including a casing, an electric circuit, and at least one fan,
    (a) said electric circuit being implemented on a printed circuit board where at least one heat generating component is a part of the electric circuit,
    (b) the casing being substantially a cuboid in shape including a U-shaped bottom and a U-shaped cover having an angled part of said U-shaped bottom and an angled part of said U-shaped cover forming a double wall portion of the casing with an inner wall portion and an outer wall portion defining an air duct between the inner wall portion and the outer wall portion,
    (c) said air duct having an inlet and an outlet and leading from a front surface to a rear surface of said casing, said inlet is at one of said front surface and said rear surface, said outlet is at the other one of said front surface and said rear surface, said heat generating component being in thermal contact with the inner wall portion, said double wall portion being a heat sink and said at least one fan being arranged such that an air flow produced by said at least one fan is directed through said air duct.

2. The device according to claim 1, characterized in that said casing is made of a metal with a high coefficient of thermal conductivity.

3. The device according to claim 1, characterized in that said bottom and said cover are fit together in thermal contact, said inner wall portion being a part of said bottom, said outer wall portion being a part of said cover, and the printed circuit board being mounted on the bottom.

4. The device according to claim 3, characterized in that it includes thermal paste between contacting parts of the bottom and the cover, said bottom and said cover being fastened together by fasteners.

5. The device according to claim 3 or 4, characterized in that said bottom includes a base plate and a bottom side plate and in that said cover includes a top plate and a cover side plate, said bottom side plate forming said inner wall portion, said cover side plate forming said outer wall portion and said printed circuit board being mounted substantially parallel to said base plate.

6. The device according to claim 5, characterized in that said cover side plate forms a lateral surface of said substantially cuboid casing.

7. The device according to claim 6, said inlet being formed by an end portion of said bottom side plate that is bent to an inner side of the casing to increase the air flow through said air duct, said at least one fan being arranged on the front surface of said substantially cuboid casing covering said inlet at least partially.

8. The device according to claim 1, characterized in that an additional heat sink is mounted within the air duct, being in thermal contact with said double wall portion.

9. The device according to claim 1, characterized in that said heat generating component is a power semiconductor.

10. The device according to claim 1, characterized in that it includes at least two fans, the casing including a second double wall portion with an inner wall portion and an outer wall portion defining a second air duct, said second double wall portion being a second heat sink and said at least two fans being arranged such that an air flow produced by said at least two fans is directed through said air ducts respectively.

11. The device according to claim 10, characterized in that said casing is substantially a cuboid in shape and has two lateral surfaces, each air duct being arranged along one of said lateral surfaces respectively and leading from a front surface of the substantially cuboid casing to a rear surface of the casing.

12. The device according to claim 1, characterized in that said casing is aluminum.

13. A casing for an electric device of the kind including an electric circuit, and at least one fan,
   (a) said electric circuit being implemented on a printed circuit board where at least one heat generating component is a part of the electric circuit,
   (b) the casing being substantially a cuboid in shape, including a U-shaped bottom and a U-shaped cover where an angled part of said U-shaped bottom and an angled part of said U-shaped cover form a double wall portion of the casing with an inner wall portion and an outer wall portion defining an air duct between the inner wall portion and the outer wall portion and leading from a front surface to a rear surface of said casing, said air duct having an inlet and an outlet, said inlet is at one of said front surface and said rear surface, said outlet is at the other one of said front surface and said rear surface,
   (c) said casing being built such that said heat generating component is in thermal contact with the inner wall portion when the electric circuit is in place and that an air flow produced by said at least one fan is directed through said air duct, said double wall portion being a heat sink of the electric device.

14. The casing according to claim 13, characterized in that said casing is made of a metal with a high coefficient of thermal conductivity.

15. The casing according to claim 14, characterized in that said casing is aluminum.

16. The casing according to claim 13, characterized in that said bottom and said cover are fitted together in thermal contact, said inner wall portion being a part of said bottom, said outer wall portion being a part of said cover, said circuit being implemented on a printed circuit board and the printed circuit board being mounted on the bottom.

17. The casing according to claim 16, characterized in that it includes thermal paste between contacting parts of the bottom and the cover, said bottom and said cover being fastened together by fasteners.

18. The casing according to claim 16, characterized in that said bottom includes a base plate and a bottom side plate and in that said cover includes a top plate and a cover side plate, said bottom side plate forming said inner wall portion, said cover side plate forming said outer wall portion and said printed circuit board being mounted substantially parallel to said base plate.

19. The casing according to claim 18, characterized in that cover side plate forms a lateral surface of said cuboid casing.

20. The casing according to claim 19, characterized in that said inlet is formed by an end portion of said bottom side plate that is bent to an inner side of the casing to increase the air flow through said air duct, said at least one fan being arranged on the front surface of said cuboid casing covering said inlet at least partially.

21. The casing according to claim 13, characterized in that an additional heat sink is mounted within the air duct, being in thermal contact with said double wall portion.

22. The casing according to claim 13, characterized in that it receives at least two fans, the casing including a second double wall portion with an inner wall portion and an outer wall portion defining a second air duct, said second double wall portion being a second heat sink and said at least two fans being arranged such that an air flow produced by said at least two fans is directed through said air ducts respectively.

23. The casing according to claim 22, characterized in that each air duct is arranged along one of said lateral surfaces respectively and leads from a front surface of the cuboid casing to a rear surface of the cuboid casing.

24. An electrical device including a casing, an electric circuit with a heat generating component and at least one fan, the heat generating component being in thermal contact with a wall portion of the casing, the casing including a double wall portion with an inner wall portion and an outer wall portion defining an air duct between the inner wall portion and the outer wall portion, said heat generating component being in thermal contact with the inner wall portion, said double wall portion being a heat sink and said at least one fan being arranged such that an air flow produced by said at least one fan is directed through said air duct, said casing being substantially a cuboid in shape and including a bottom and a cover fitted together in thermal contact, said inner wall portion being a part of said bottom, said outer wall portion being a part of said cover, said circuit being implemented on a printed circuit board and the printed circuit board being mounted on the bottom, said bottom including a base plate and a bottom side plate, said cover including a top plate and a cover side plate, said bottom side plate forming said inner wall portion, said cover side pate forming said outer wall portion and said printed circuit board being mounted substantially parallel to said base plate, said cover side plate forming a lateral surface of said substantially cuboid casing, said air duct leading from a front surface to a rear surface of said casing, said air duct having an inlet, said inlet being formed by an end portion of said bottom side plate that is bent to an inner side of the casing to increase the air flow through said air duct, and said at least one fan being arranged on the front surface of said substantially cuboid casing covering said inlet at least partially.

25. A casing for an electrical device of the kind including an electric circuit with a heat generating component and at least one fan, the casing characterized in that the casing includes a double wall portion with an inner wall portion and an outer wall portion defining an air duct between the inner wall portion and the outer wall portion and being built such that said heat generating component is in thermal contact with the inner wall portion when the electric circuit is in place and that an air flow produced by said at least one fan is directed through said air duct, said double wall portion being a heat sink of the electrical device, said casing being substantially a cuboid in shape and including a bottom and a cover fitted together in thermal contact, said inner wall portion being a part of said bottom, said outer wall portion being a part of said cover, said circuit being implemented on a printed circuit board and the printed circuit board being mounted on the bottom, said bottom including a base plate and a bottom side plate and said cover including a top plate and a cover side plate, said bottom side plate forming said inner wall portion, said cover side plate forming said outer wall portion and said printed circuit board being mounted substantially parallel to said base plate, said cover side plate forming a lateral surface of said cubical casing, said air duct leading from a front surface to a rear surface of said cubical casing, and said air duct having an inlet, said inlet being formed by an end portion of said bottom side plate that is bent to an inner side of the casing to increase the air flow through said air duct and said at least one fan being arranged on the front surface of said cubical casing covering said inlet at least partially.

* * * * *